US007005853B2

(12) United States Patent
Tsao et al.

(10) Patent No.: US 7,005,853 B2
(45) Date of Patent: Feb. 28, 2006

(54) PRIOR-INFORMATION-ENHANCED DYNAMIC MAGNETIC RESONANCE IMAGING

(75) Inventors: Jeffrey Tsao, Basel (CH); Klaas Paul Pruessmann, Zurich (CH); Peter Boesiger, Ennetbaden (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/514,438

(22) PCT Filed: May 9, 2003

(86) PCT No.: PCT/IB03/01929

§ 371 (c)(1),
(2), (4) Date: Nov. 12, 2004

(87) PCT Pub. No.: WO03/096047

PCT Pub. Date: Nov. 20, 2003

(65) Prior Publication Data

US 2005/0189942 A1    Sep. 1, 2005

(30) Foreign Application Priority Data

May 13, 2002   (EP)   .................................. 02076843

(51) Int. Cl.
  *G01V 3/00*   (2006.01)
  *A61B 5/055*  (2006.01)
(52) U.S. Cl. ..................... 324/309; 324/307; 324/318; 600/410
(58) Field of Classification Search ................ 324/307, 324/309; 382/128–131; 600/407, 410
  See application file for complete search history.

(56) References Cited

U.S. PATENT DOCUMENTS

| | | | | |
|---|---|---|---|---|
| 6,289,232 B1 * | 9/2001 | Jakob et al. | ................. | 600/410 |
| 6,448,771 B1 * | 9/2002 | Harvey et al. | .............. | 324/307 |
| 6,518,760 B1 * | 2/2003 | Fuderer et al. | ............. | 324/307 |
| 6,556,009 B1 * | 4/2003 | Kellman et al. | ............ | 324/309 |
| 6,714,010 B1 * | 3/2004 | Madore | ...................... | 324/307 |
| 6,745,064 B1 * | 6/2004 | Fuderer et al. | ............. | 600/410 |
| 6,771,067 B1 * | 8/2004 | Kellman et al. | ............ | 324/307 |
| 6,778,689 B1 * | 8/2004 | Aksit et al. | ................. | 382/128 |
| 2002/0039024 A1 * | 4/2002 | Fuderer et al. | ............. | 324/307 |
| 2002/0042568 A1 * | 4/2002 | Fuderer et al. | ............. | 600/410 |
| 2002/0060567 A1 * | 5/2002 | Harvey et al. | .............. | 324/307 |
| 2002/0097050 A1 * | 7/2002 | Kellman et al. | ............ | 324/309 |

(Continued)

FOREIGN PATENT DOCUMENTS

WO   WO 98/21600   5/1998

(Continued)

OTHER PUBLICATIONS

Jones, R.A., et al.; K-Space Substitution: A novel dynamic imaging technique; Magnetic Resonance in Medicine; 1993; vol. 29, No. 6, pp. 830-834.

(Continued)

*Primary Examiner*—Diego Gutierrez
*Assistant Examiner*—Tiffany A. Fetzner
(74) *Attorney, Agent, or Firm*—Thomas M. Lundin

(57) ABSTRACT

Successive magnetic resonance images are reconstructed from the respective sets of magnetic resonance signals of the dynamic series on the basis of the identified distribution of likelihood of changes and optionally the static reference image. The magnetic resonance signals are acquired by way of a receiver antennae system having a spatial sensitivity profile and in an undersampled fashion and the successive magnetic resonance images are reconstructed optionally also on the basis of the spatial sensitivity profile.

13 Claims, 2 Drawing Sheets

U.S. PATENT DOCUMENTS

| | | | |
|---|---|---|---|
| 2002/0153890 A1* | 10/2002 | Madore | 324/307 |
| 2002/0156364 A1* | 10/2002 | Madore | 600/410 |
| 2002/0167315 A1* | 11/2002 | Kellman et al. | 324/307 |
| 2004/0070394 A1* | 4/2004 | Ballester et al. | 324/307 |
| 2004/0150400 A1* | 8/2004 | Fuderer et al. | 324/309 |
| 2005/0020897 A1* | 1/2005 | Fuderer | 600/407 |
| 2005/0189942 A1* | 9/2005 | Tsao et al. | 324/310 |

FOREIGN PATENT DOCUMENTS

| | | |
|---|---|---|
| WO | WO 99/54746 | 10/1999 |
| WO | WO 02/10788 | 2/2002 |
| WO | WO 03/096047 | * 11/2003 |

OTHER PUBLICATIONS

Pruessmann, Klaas, et al.; SENSE: Sensitivity Encoding for Fast MRI; Magnetic Resonance in Medicine; 1999; vol. 42, pp. 952-962.

Tsao, Jeffrey, et al.; Unifying Linear Prior-Information-Driven Methods for Accelerated Image Acq.; Magnetic Resonance in Medicine; Oct. 2001; vol. 46, pp. 652-660.

Tsao, Jeffrey, et al.; Prior-Information-Enhanced Dynamic Imaging Using Single or Multiple Coils; Proc. Intl Soc. M.R. in Med. 10th Mtg.-Honolulu; 2002; pp. 2369.

* cited by examiner

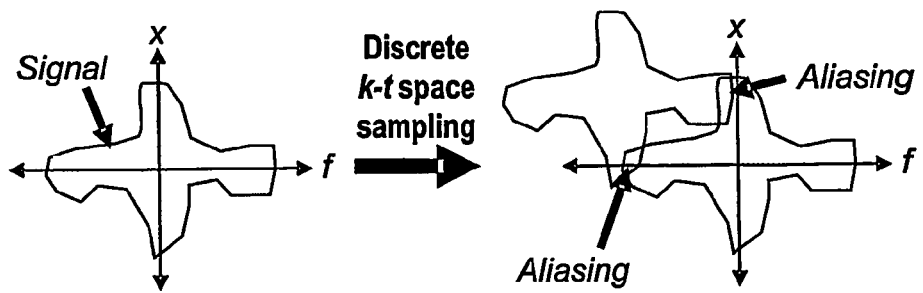
FIG.1
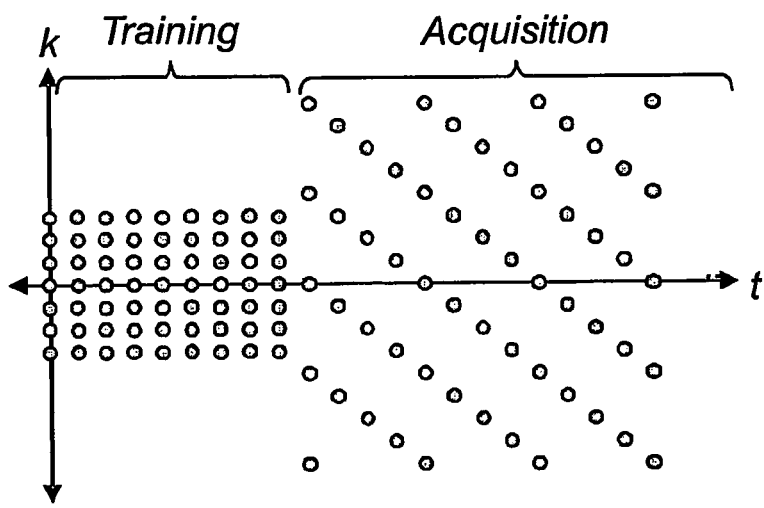
FIG.2
FIG.3
Reconstruction
Error x 5
Results
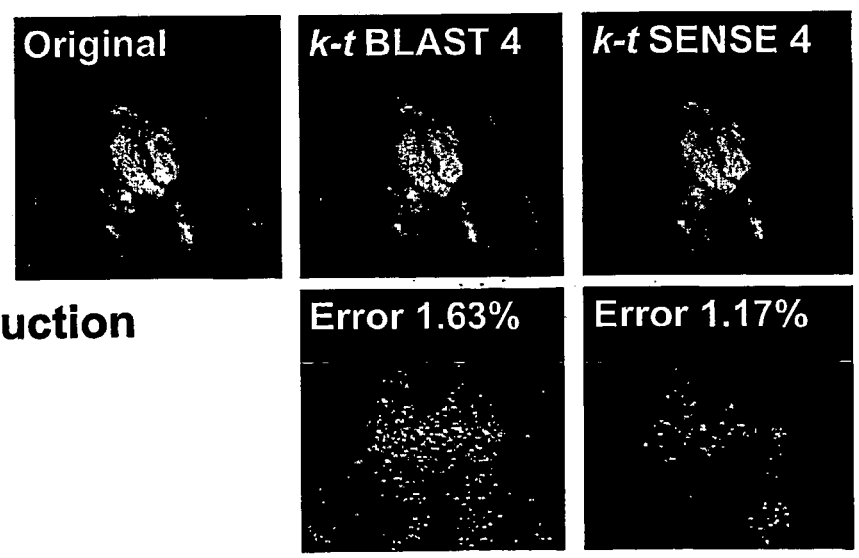

PRIOR-INFORMATION-ENHANCED DYNAMIC MAGNETIC RESONANCE IMAGING

This application is an international 371 filing of PCT/IB03/01929 that was filed May 9, 2003, and claims priority therefrom. Additionally, this application also claims priority from EUROPEAN PATENT OFFICE (EPO) application 02076843.8 filed May 13, 2002.

BACKGROUND

The invention pertains to magnetic resonance imaging method to produce successive magnetic resonance images.

Such a magnetic resonance imaging method is known from the paper 'Unifying linear prior-information-driven methods for accelerated image acquisition' by J. Tsao et al. in MRM46(2001)652–660.

The known magnetic resonance imaging method concerns an acquisition and reconstruction strategy which aims at faster image acquisition. The known magnetic resonance imaging method is familiar in the technical field of magnetic resonance imaging as Broad-use Linear Acquisition Speed-up Technique (BLAST). In the known method a static reference image is reconstructed from a training set of magnetic resonance signals,

- a distribution of likelihood of changes in the successive magnetic resonance images is identified from the static reference image,
- a dynamic series of sets of magnetic resonance signals is acquired and
- the successive magnetic resonance images are reconstructed from the respective sets of magnetic resonance signals of the dynamic series on the basis of the identified distribution of likelihood of changes, and the static reference image.

According to the known method sampling of the dynamic series of sets magnetic resonance signals is reduced to speed up acquisition. The sampling of magnetic resonance signals is made quite effective by constraining the reconstruction to regions in which changes are likely. The successive magnetic resonance image are reconstructed on the basis of the static reference image together with the later acquired dynamic series of sets of magnetic resonance signals; this dynamic series adequately take into account changes that have occurred after the acquisition of the training set of magnetic resonance signals which led to the static reference image.

Although the known method successfully reduces the signal acquisition time, it has several known limitations. Firstly, it requires the acquisition of a static reference image, when the object exhibits little or no motion. This may not be possible for applications where continuous motion is involved, such as cardiac imaging. Secondly, the known method assumes that the spatial distribution of likelihood of changes is known, but it does not describe a technique for estimating it. Therefore, the known method is restricted to applications where such spatial distribution can be obtained by other means. Thus, it has appeared that there is an ongoing need to shorten the signal acquisition time in order to better handle rapid and continuous object motion and to further reduce image artifacts.

An object of the invention is to provide a magnetic resonance imaging method which requires the same or an even shorter signal acquisition time relative to the known method, but without the associated restrictions while achieving reduced image artifacts and consequently improved image quality.

This object is achieved according to the invention wherein successive sets of magnetic resonance signals are acquired by successively scanning respective sets of points in k-space such that the successive scanning builds up sampling of k-space at the successive scanning covers more frequently a predetermined portion of k-space at full sampling density and successive magnetic resonance images are reconstructed from the successive sets of magnetic resonance signals.

According to the invention, full sampling of k-space is built up from the successive sets of magnetic resonance signals, where individual sets of magnetic resonance signals at each instant in time may be undersampled. Accordingly, sampling is built up in time and even full sampling can be achieved as more and more successive sets of magnetic resonance signals are acquired. Further, a predetermined portion of k-space is repeatedly revisited to achieve full sampling of the predetermined portion earlier than the full sampling of k-space as a whole. This fully sampled predetermined portion of k-space is employed as a training dataset on the basis of which aliasing artefacts caused by the undersampling in the individual sets of magnetic resonance signals. Preferably, the predetermined portion of k-space that is repeatedly revisited concerns a central region of k-space, such as one ore several bands in the $k_y$-$k_z$ plane located around $k_z=0$ or $k_y=0$.

The invention relies on the insight that magnetic resonance signals are generally concentrated in the central portion of k-space. Hence, by successive sampling of different positions in the central portion of k-space at different instants, the distribution of likelihood of changes can be identified from the training data. This distribution is identified in the space spanned by geometrical space alone or by geometrical space and temporal frequency.

The invention further relies on the insight that by definition, the static reference image does not change over time. Hence, by successive sampling of different positions of k-space at different instants, sampling at full sampling density of k-space is obtained, thus yielding a fully sampled image, which can be used optionally to obtain a static reference image. Then, for the peripheral zones of k-space, or for the entire k-space if the training data are acquired in a separate scan, only a sub-sampled set of magnetic resonance signals may be acquired. This reduces the time required for scanning the periphery of k-space, or in a pre-set available time, the periphery of k-space can be scanned outwardly to a larger extent. Any aliasing or fold-over involved in the magnetic resonance signals from the sub-sampled portion of k-space is lifted on the basis of the identified distribution of likelihood of changes and optionally the static reference image. Full sampling in this respect indicates a sampling density at wavenumber steps less than the reciprocal 'field-of-view'. Sub-sampling involves a sampling of k-space at at sampling density less than full sampling density.

In a preferred implementation of magnetic resonance imaging method of the invention is arranged to produce successive magnetic resonance images wherein two of successive magnetic resonance signals are acquired in separate scans or in the same scan by successively scanning respective sets of points in k-space such that the first set successively scans the central portion or other portions of k-space where the magnetic resonance signals are known to be concentrated to yield successive training data the second set successively scans respective sets of points in k-space in an undersampled fashion to yield a dynamic series of successive undersampled data a static reference image is optionally formed from the training set of magnetic resonance signals, a distribution of likelihood of changes in the successive magnetic resonance images is identified from the static reference image and/or the training data, in the space spanned by geometrical space alone or by geometrical space and temporal frequency, and the successive magnetic resonance images are reconstructed from the respective sets of magnetic resonance signals of the dynamic series on the basis of the identified distribution of likelihood of changes and if available, the static reference image The likelihood of change is updated from from time point to time point, so that method of the invention takes temporal changes in the likelihood of changes into account.

In a preferred implementation the central portion of k-space is successively sampled at a higher sampling than the peripheral region of k-space, for example at the full sampling density. The acquired data can then be separated into two sets of magnetic resonance signals for reconstruction: training data and subsampled data. These two sets of data may share some common data points. The training data are used to identify the distribution of likelihood of changes, while the subsampled data are used optionally to determine the static reference image. The static reference image is optionally reconstructed from the training data and/or undersampled data, or from data acquired separately during time periods with little or no motion.

Then, the successive magnetic resonance images are reconstructed from the sub-sampled magnetic resonance signals on the basis of the identified distribution of likelihood of changes and if available, the static reference image. Accordingly, sparse, i.e. sub-sampled, sampling and sampling of the low-resolution of training data from the centre portion of k-space is integrated into a single scan.

In another preferred implementation, the magnetic resonance signals are acquired by way of a receiver antennae system having a spatial sensitivity profile. The antennae system contains a number of signal channels, which process magnetic resonance signals from respective receiver antennae, such as surface coils. Often, the spatial sensitivity profile only shows very slow temporal variations, or the spatial sensitivity profiles does not change with time. Such slow variations may be caused by slight movement of surface coils that are employed as receiver antennae and that are placed on the body of the patient to be examined. Such slight movement may be caused by respiratory motion of the patient to be examined. The spatial sensitivity profile of the receiver antennae system are derived from the static reference images or any time averaged images constructed from the sub-sampled magnetic resonance signals. The temporal averaging for constructing such images should be long enough such that k-space, at least the central portion, has been fully sampled. The successive magnetic resonance images are reconstructed from the sub-sampled magnetic resonance signals also on the basis of the derived spatial sensitivity of the receiver antennae system.

The signal channels process magnetic resonance signals from respective receiver antennae, such as surface coils. For each signal channel, successive sets of magnetic resonance signals are acquired and reconstructed separately and independently on the basis of the training data and optionally the static reference image, both obtained from the data from the same signal channel. This yields a separate series of successive magnetic resonance images for each signal channel. The successive magnetic resonance images from the multiple signal channels are combined without explicit a priori knowledge of the coil sensitivity profile by calculating the root mean square of the image intensity on a voxel-by-voxel basis.

The present invention is particularly advantageously employed in steady-state free processing imaging (SSFP). Power deposition is notably high at stationary magnetic fields of 3T or more, say 7T. The present invention allows substantial reduction in data acquisition, allowing for substantially reduced power deposition.

Further, the present invention appears to operate particularly advantageously when employed in conjunction with a tagging technique, such as CSPAMM. CSPAMM generates a tagging pattern in a region of interest, e.g. in a region that includes the patient's heart. Such tagging techniques have proven to be very valuable in extending the understanding of e.g. cardiac dynamics. CSPAMM tagging can be employed to generate a three-dimensional tagging pattern. Preferably, when the present invention is applied with a tagging technique, in the central region, one or more central bands in $k_y$-$k_z$ space are fully sampled, providing the low resolution training data and the outer regions are sub-sampled along a sheared grid pattern in k-t space. A net 2.5 fold reduction in scan time relative to full sampling is achieved.

According to the invention, parallel imaging techniques for the signal acquisition and the reconstruction of the magnetic resonance images are incorporated in the known BLAST method, with extension to k-t space i.e. the space spanned by the wavevectors of the magnetic resonance signals, i.e. k-space and time. The parallel imaging techniques, such as SENSE and SMASH involve receiving the magnetic resonance signals in an undersampled fashion so that the received magnetic resonance signals include superposed contributions from spatial positions that are an integer number of 'field-of views' apart. This superposition is then decomposed into contributions for separate spatial position on the basis of the distribution of likelihood of changes, and optionally the static reference image and the spatial sensitivity profile of the system of receiver antennae system: Preferably, a set of surface coils is employed as a receiver antennae system.

For the acquisition of the training set of magnetic resonance signals the acquisition strategy may be chosen from a very wide variety. Some degree of undersampling may be used to reduce the acquisition time for the training set. As the training set is acquired only once, or maybe is refreshed a few times, relatively little time is gained by undersampling the training set. More preferably, the training set is acquired such that the static reference image has a high spatial resolution and has a very low number of artefacts. This is notably achieved in that the training set is acquired with a high k-space sampling density or when some degree of undersampling is employed, unfolding of aliasing artefacts is undone on the basis of a very accurately determined spatial sensitivity profile of the receiver antennae system.

The time required for acquisition of the magnetic resonance (MR) signals is reduced by employing sub-sampling of the MR-signals. Such sub-sampling involves a reduction in k-space of the number of sampled points which can be achieved in various ways. Notably, the MR signals are picked-up through signal channels pertaining to several receiver antennae, such as receiver coils, preferably surface coils. Acquisition through several signal channels enables parallel acquisition of signals so as to further reduce the signal acquisition time.

Owing to the sub-sampling, sampled data contain contributions from several positions in the object being imaged. The magnetic resonance image is reconstructed from the sub-sampled MR-signals on the basis of the the distribution of likelihood of changes, and and optionally the static reference image and a sensitivity profile associated with the signal channels. Notably, the sensitivity profile is for example the spatial sensitivity profile of the receiver antennae, such as receiver coils. Preferably, surface coils are employed as the receiver antennae. The reconstructed magnetic resonance image may be considered as being composed of a large number of spatial harmonic components which are associated with brightness/contrast variations at respective wavelengths. The resolution of the magnetic resonance image is determined by the smallest wavelength, that is by the highest wavenumber (k-value). The largest wavelength, i.e. the smallest wavenumber, involved, is the field-of-view (FOV) of the magnetic resonance image. The resolution is determined by the ratio of the field-of-view and the number of samples.

The sub sampling may be achieved in that respective receiver antennae acquire MR signals such that their resolution in k-space is coarser than required for the resolution of the magnetic resonance image. The smallest wavenumber sampled, i.e. the minimum step-size in k-space, is increased while the largest wavenumber sampled is maintained. Hence, The image resolution remains the same when applying sub-sampling, while the minimum k-space step increases, i.e. the FOV decreases. The sub-sampling may be achieved by reduction of the sample density in k-space, for instance by skipping lines in the scanning of k-space so that lines in k-space are scanned which are more widely separated than required for the resolution of the magnetic resonance image. The sub-sampling may be achieved by reducing the field-of-view while maintaining the largest k-value so that the number of sampled points is accordingly reduced. Owing to the reduced field-of-view sampled data contain contributions from several positions in the object being imaged.

Notably, when receiver coil images are reconstructed from sub-sampled MR-signals from respective receiver coils, such receiver coil images contain aliasing artefacts caused by the reduced field-of-view. From the receiver coil images and the sensitivity profiles the contributions in individual positions of the receiver coil images from different positions in the image are disentangled and the magnetic resonance image is reconstructed. This MR-imaging method is known as such under the acronym SENSE-method. This SENSE-method is discussed in more detail in the international application no. WO 99/54746-A1.

Alternatively, the sub-sampled MR-signals may be combined into combined MR-signals which provide sampling of k-space corresponding to the full field-of-view. In particular, according to the so-called SMASH-method sub-sampled MR-signals approximate low-order spatial harmonics which are combined according to the sensitivity profiles. The SMASH-method is known as such from the international application no. WO 98/21600. Sub-sampling may also be carried-out spatially. In that case the spatial resolution of the MR-signals is less than the resolution of the magnetic resonance image and MR-signals corresponding to a full resolution of the magnetic resonance image are formed on the basis of the sensitivity profile. Spatial sub-sampling is in particular achieved in that MR-signals in separate signal channels, e.g. from individual receiver coils, form a combination of contributions from several portions of the object. Such portions are for example simultaneously excited slices. Often the MR-signals in each signal channel form linear combinations of contributions from several portions, e.g. slices. This linear combination involves the sensitivity profile associated with the signal channels, i.e. of the receiver coils. Thus, the MR-signals of the respective signal channels and the MR-signals of respective portions (slices) are related by a sensitivity matrix which represents weights of the contribution of several portions of the object in the respective signal channels due to the sensitivity profile. By inversion of the sensitivity matrix, MR-signals pertaining to respective portions of the object are derived. In particular MR-signals from respective slices are derived and magnetic resonance images of these slices are reconstructed.

The invention also relates to a magnetic resonance imaging system. It is an object of the invention to provide a magnetic resonance imaging system for carrying out the magnetic resonance imaging methods according to the invention. A magnetic resonance imaging system of this kind is defined in the independent Claim 6. The functions of a magnetic resonance imaging system according to the invention are preferably carried out by means of a suitably programmed computer or (micro)processor or by means of a special purpose processor provided with integrated electronic or opto-electronic circuits especially designed for the execution of one or more of the magnetic resonance imaging methods according to the invention.

The invention also relates to a computer program with instructions for executing a magnetic resonance imaging method. It is a further object of the invention to provide a computer program whereby one or more of the magnetic resonance imaging methods according to the invention can be carried out. A computer program according to the invention is defined in the independent Claim 7. When such a computer program according to the invention is loaded into the computer of a magnetic resonance imaging system, the magnetic resonance imaging system will be capable of executing one or more magnetic resonance imaging methods according to the invention. For example, a magnetic resonance imaging system according to the invention is a magnetic resonance imaging system whose computer is loaded with a computer program according to the invention. Such a computer program can be stored on a carrier such as a CD-ROM. The computer program is then loaded into the computer by reading the computer program from the carrier, for example by means of a CD-ROM player, and by storing the computer program in the memory of the computer of the magnetic resonance imaging system.

BRIEF DESCRIPTION OF THE DRAWINGS

These and other aspects of the invention will be elucidated with reference to the embodiments described hereinafter and with reference to the accompanying drawing wherein FIG. 1. Support in x-f space (grey shape, left). x and f denote spatial co-ordinates and temporal frequency, respectively. Support is convoluted with a point spread function after k-t space sampling, thus leading to potential aliasing.

FIG. 2. (a) k-t space sampling pattern that is periodic in space and time and also forms a grid pattern. The dots represent the sampled positions in k-t space. In this example, every $8^{th}$ phase-encode line is acquired at every time frame t (b) The corresponding point spread function in discrete x-f space obtained by inverse Fourier transforming the k-t sampling pattern. Note that there are only 8 non-zero points in the point spread function FIG. 3. reconstruction results

DETAILED DESCRIPTION

Figure 4:
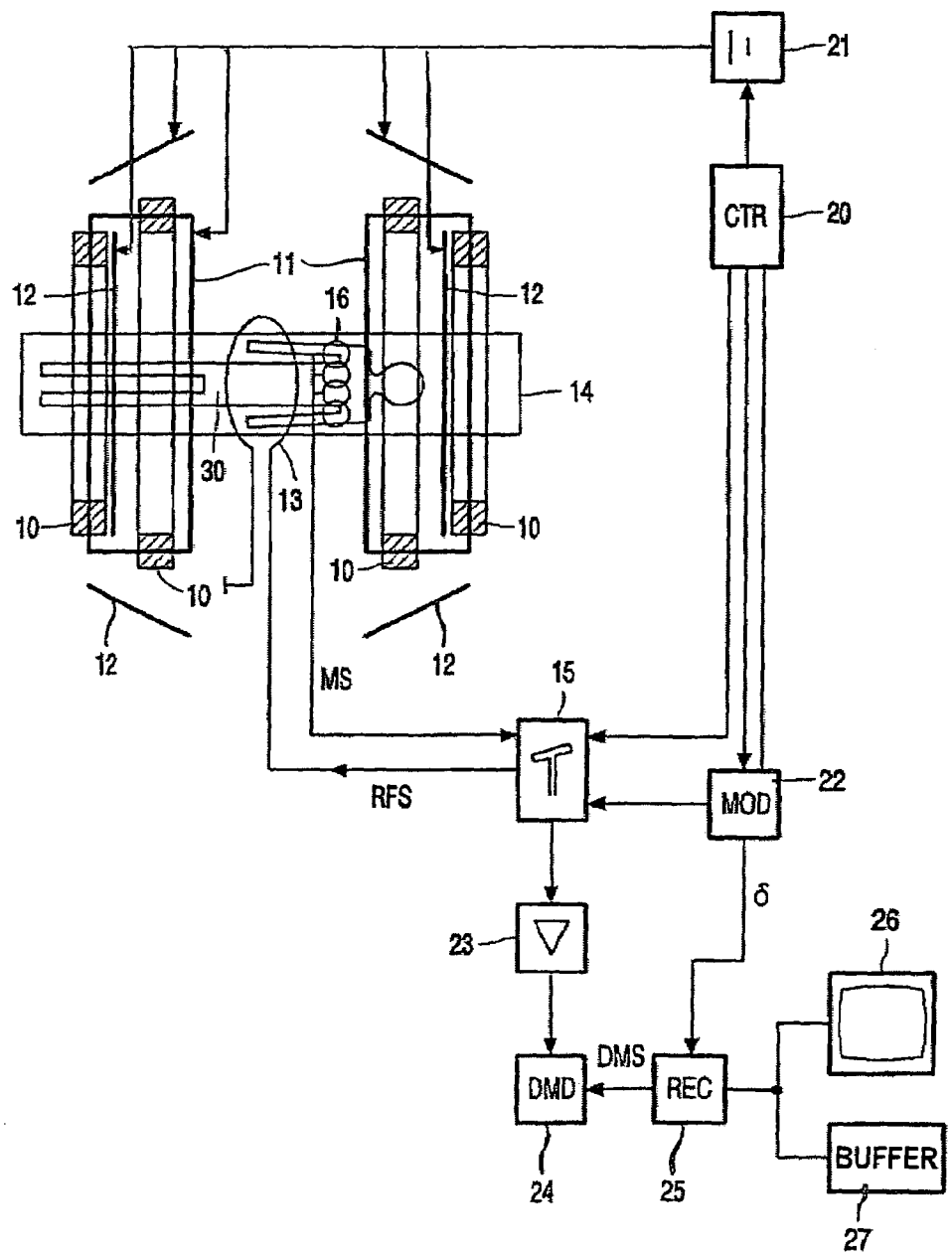
FIG. 4 shows diagrammatically a magnetic resonance imaging system in which the invention is used.

Fast dynamic imaging requires efficient sampling of k-t space, i.e. the space spanned by the wavevectors of the magnetic resonance signals, i.e. k-space and time. Existing k-t space imaging methods use (or search for) a suitable sampling pattern that prevents the image signals in the reciprocal x-f space, i.e. the geometrical (real) space and frequency, from aliasing. Thus, the fundamental limit lies in the maximum packing of x-f space signals. In the present invention, space extension of the BLAST method is presented, which allows the aliasing to be partially resolved in a weighted least-squares manner. This formulation extends to the use of multiple coils, such as from parallel imaging, which helps to further resolve the aliasing.

Introduction

In dynamic imaging, data are acquired at discrete locations in k-space over time. From the properties of Fourier transformation, sampling in k-t space leads to convolution of the image signals in the reciprocal x-f space with a point spread function. If the k-t space sampling pattern is a grid-like pattern (i.e. a lattice), the resulting point spread function will lead to a periodic replication of the x-f space signals (FIG. 1). Thus, if the sampling lattice can be adjusted so that the replicates of the x-f space signals do not overlap (i.e. alias) significantly, a nearly error-free reconstruction can be obtained from the acquired k-t space data. However, the need to avoid any significant aliasing places, a stringent requirement on the sampling pattern, as it is related to the geometric packing of image signals in x-f space.

If some aliasing is allowed in certain parts of x-f space, further efficiency can be gained in the k-t space sampling pattern. The resulting aliasing can still be partially resolved in a weighted least-squares fashion, if an estimate of the signals is available. This approach is an extension of the BLAST (Broad-use Linear Acquisition Speed-up Technique) method to k-t space, using a reference image as prior information to partially resolve the aliasing. If multiple receiver coils with different sensitivities are available such as in the SENSE (SENSitivity Encoding) method, the additional data can be used to further resolve the aliasing in a multi-coil version of this formulation.

Methods

In BLAST, the reconstructed image is determined as the solution to the following linear system (data-consistency constraint):

$$FT\{\rho(\bar{x})\}(\bar{k}_t) = d(\bar{k}_t) \quad [1]$$

where $FT\{.\}$ denotes Fourier transformation; $d(\bar{k}_t)$ is the measured data at the 1th k-space position. BLAST determines $\rho(\bar{x})$ as the feasible solution of Eq. [1] that minimises the following norm:

$$\int \|\rho(\bar{x}) - R_{static}(\bar{x})\|^2 / \|R_{dynamic}(\bar{x}) + \lambda\|^2 d\bar{x} \quad [2]$$

where $R_{static}(\bar{x})$ is the static reference image, showing the baseline signals; $R_{dynamic}(\bar{x})$ is the dynamic reference image, highlighting the probable areas of change from baseline; $\lambda$ is a scalar-valued regularise to improve conditioning of the linear system. In the k-t space formulation, $\bar{x}$ denotes spatial co-ordinates and temporal frequency, while $\bar{k}_t$ denotes k-space position and time. A multi-coil version of Eq. [2] is:

$$FT\{\rho(\bar{x}) \cdot S_j(\bar{x})\}(\bar{k}_t) = d_j(\bar{k}_t) \quad [3]$$

where $S_j(\bar{x})$ and $d_j(\bar{k}_t)$ denote the sensitivity map and the data measured from the $j^{th}$ coil respectively.

A version of the proposed method that is easy to implement is to divide the acquisition into the training and the acquisition phases (although other schemes are also possible) (FIG. 2). In the training phase, one obtains prior information to construct $R_{dynamic}(\bar{x})$ by sampling k-space at the full field of view but at a low spatial resolution. Depending on the similarity (e.g. in contrast) between the images acquired from the training and acquisition phases, $R_{dynamic}(\bar{x})$ can be set to several possible choices, including:

1. the Fourier reconstructed magnitude of the training data in x-f space;
2. a fixed temporal frequency filter in x-f space multiplied by a blurred thresholded version of the Fourier reconstructed training data to highlight probable areas of change.

For any choice of $R_{dynamic}(\bar{x})$, its temporal frequency DC ("direct current") term is set to zero, as the DC term is estimated separately below.

In the acquisition phase, k-space is sparsely sampled. A sequential interleaved pattern is shown in FIG. 2 for simplicity, but other sampling patterns are possible. $R_{static}(\bar{x})$ is set to zero, except for the temporal frequency DC term, which is determined from the temporal average of all data in the acquisition phase. Images are reconstructed by least-squares fitting of Eqs. [1] or [3] to the sparsely sampled data (with weighting according to Eq. [2]). If the k-t space sampling pattern is periodic, the computation simplifies tremendously, in a similar fashion to the simplification for Cartesian SENSE or Multiple Region MRI.

Results & Discussion

Simulation results are shown using a previously reconstructed cardiac image sequence. 40 frames were used in low resolution (16 phase-encode lines) for training, while only 25% of the data in the remaining 160 frames were used for reconstruction, simulating a fourfold acceleration. The reconstructions with a single or 6 receiver coils were compared with the original images. Error values indicate the relative root-mean-squared (RMS) reconstruction errors (100%=RMS original signal intensity). The errors were <2% in both cases. As expected, the errors were lower for the multi-coil case due to the data from additional coils.

The results show a promising single-/multi-coil approach for efficient and flexible dynamic imaging. Increased acceleration is afforded by allowing slight overlaps in x-f space, which can be partially resolved with the use of prior information, and the slight overlaps result in negligible reconstruction errors. Finally, the k-t space sampling does not need to be optimised for each specific case, FIG. 4 shows diagrammatically a magnetic resonance imaging system in which the invention is used.

The magnetic resonance imaging system includes a set of main coils 10 whereby the steady, uniform magnetic field is generated. The main coils are constructed, for example in such a manner that they enclose a tunnel-shaped examination space. The patient to be examined is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a controllable power supply unit 21. The gradient coils 11, 12 are energized by application of an electric current by means of the power supply unit 21 under control of a control circuit 20. The strength, direction and duration of the gradients are controlled by control of the power supply unit.

The magnetic resonance imaging system also includes transmission and receiving coils 13, 16 for generating the RF excitation pulses under control of the control circuit and via a modulator or transmitter 22 and transmit/receive circuit 15 and for picking up the magnetic resonance signals, respectively. The transmission coil 13 is preferably constructed as a body coil whereby (a part of) the object to be examined can be enclosed. The body coil is usually arranged in the magnetic resonance imaging system in such a manner that the patient 30 to be examined, being arranged in the magnetic resonance imaging system, is enclosed by the body coil 13. The body coil 13 acts as a transmission aerial for the transmission of the R excitation pulses and R refocusing pulses. Preferably, the body coil 13 involves a spatially uniform intensity distribution of the transmitted R pulses RFS. The receiving coils 16 are preferably surface coils 16 which are arranged on or near the body of the patient 30 to be examined. Such surface coils 16 have a high sensitivity for the reception of magnetic resonance signals MS which is also spatially inhomogeneous. This means that individual surface coils 16 are mainly sensitive for magnetic resonance signals originating from separate directions, i.e. from separate parts in space of the body of the patient to be examined. The coil sensitivity profile represents the spatial sensitivity of the set of surface coils.

The transmission coils, notably surface coils, are connected by the transmit/receive circuit 15 and an amplifier 23 to a demodulator 24 and the received magnetic resonance signals (MS) are demodulated by means of the demodulator 24. The demodulated magnetic resonance signals (DMS) are applied to a reconstruction unit. The reconstruction unit reconstructs the magnetic resonance image from the demodulated magnetic resonance signals (DMS) and on the basis of the coil sensitivity profile of the set of surface coils. The coil sensitivity profile has been measured in advance and is stored, for example electronically, in a memory unit which is included in the reconstruction unit. The reconstruction unit derives one or more image signals from the demodulated magnetic resonance signals (DMS), which image signals represent one or more, possibly successive magnetic resonance images. This means that the signal levels of the image signal of such a magnetic resonance image represent the brightness values of the relevant magnetic resonance image.

A reconstruction unit 25 in practice is preferably constructed as a digital image processing unit 25 which is programmed so as to reconstruct the magnetic resonance image from the demodulated magnetic resonance signals and on the basis of the coil sensitivity profile. The digital image processing unit 25 is notably programmed so as to execute the reconstruction in conformity with the so-called SENSE technique or the so-called SMASH technique. The image signal from the reconstruction unit is applied to a monitor 26 so that the monitor can display the image information of the magnetic resonance image (images). It is also possible to store the image signal in a buffer unit 27 while awaiting further processing, for example printing in the form of a hard copy.

In order to form a magnetic resonance image or a series of successive magnetic resonance images of the patient to be examined, the body of the patient is exposed to the magnetic field prevailing in the examination space. The steady, uniform magnetic field, i.e. the main field, orients a small excess number of the spins in the body of the patient to be examined in the direction of the main field. This generates a (small) net macroscopic magnetization in the body. These spins are, for example nuclear spins such as of the hydrogen nuclei (protons), but electron spins may also be concerned. The magnetization is locally influenced by application of the gradient fields. For example, the gradient coils 12 apply a selection gradient in order to select a more or less thin slice of the body. Subsequently, the transmission coils apply the RF excitation pulse to the examination space in which the part to be imaged of the patient to be examined is situated. The RF excitation pulse excites the spins in the selected slice, i.e. the net magnetization then performs a precessional motion about the direction of the main field. During this operation those spins are excited which have a Larmor frequency within the frequency band of the RF excitation pulse in the main field. However, it is also very well possible to excite the spins in a part of the body which is much larger than such a thin slice; for example, the spins can be excited in a three-dimensional part which extends substantially in three directions in the body. After the RF excitation, the spins slowly return to their initial state and the macroscopic magnetization returns to its (thermal) state of equilibrium. The relaxing spins then emit magnetic resonance signals. Because of the application of a read-out gradient and a phase encoding gradient, the magnetic resonance signals have a plurality of frequency components which encode the spatial positions in, for example the selected slice. The k space is scanned by the magnetic resonance signals by application of the read-out gradients and the phase encoding gradients. According to the invention, the application of notably the phase encoding gradients results in the sub-sampling of the k space, relative to a predetermined spatial resolution of the magnetic resonance image. For example, a number of lines which is too small for the predetermined resolution of the magnetic resonance image, for example only half the number of lines, is scanned in the although sampling optimisation can be used to further improve the reconstruction.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A magnetic resonance imaging method to produce successive magnetic resonance images of a region of a static subject, the magnetic resonance imaging method comprising:

acquiring temporally successive sets of magnetic resonance signals from the region of the subject, wherein the region contains a moving subregion of the subject, by successively scanning the region to produce respective sparsely sampled sets of data points in k-space such that (i) the successive scanning builds up a sampling density of k-space and (ii) the successive scanning of the region covers more frequently a predetermined portion of k-space such that the predetermined portion is fully sampled;

determining a static MR image directly from the acquired temporally successive sets of magnetic resonance signals; and reconstructing temporally successive magnetic resonance images from a combination of the successive sets of magnetic resonance signals, the static MR image, and a spatial distribution of a likelihood of changes in the successively reconstructed magnetic resonance images.

2. A magnetic resonance imaging method as claimed in claim 1, wherein the successive scanning generates:
   successive updates of a training set of magnetic resonance signals formed from the magnetic resonance signals, which successively scanned the predetermined portion of k-space,
   successive updates of an undersampled set of magnetic resonance signals formed from the magnetic resonance signals, which successively scanned the entire k-space in an undersampled fashion, and
   the distribution of likelihood of changes in the successively reconstructed magnetic resonance images is identified from at least one of the static MR image and the training data, either (1) in the space spanned by geometrical space alone or by the combination of the geometrical space and temporal frequency.

3. A magnetic resonance imaging method as claimed in claim 2, wherein
   the reconstructed magnetic resonance signals are acquired by way of a receiver antennae system having a spatial sensitivity profile and in that
   the spatial sensitivity profile is derived from at least one of the training data or the undersampled data after time averaging, or from separately acquired data;
   the successive magnetic resonance images are reconstructed also on the basis of the derived spatial sensitivity profile.

4. A magnetic resonance imaging method as claimed in claim 2, wherein
   the reconstructed magnetic resonance signals are acquired by way of a receiver antennae system having a spatial sensitivity profile
   the reconstructed magnetic resonance signals are acquired along a number of signal channels,
   the successive magnetic resonance images are reconstructed separately and independently for each signal channel, and
   successive magnetic resonance images from the multiple signal channels are combined by calculating a root mean square of signal intensity on a voxel-by-voxel basis, without knowledge of the spatial sensitivity profile.

5. A magnetic resonance imaging system arranged in order to
   acquire a training set of magnetic resonance signals,
   acquire a dynamic series of sets of magnetic resonance signals in an undersampled fashion with a receiver antenna system having a spatial sensitivity profile;
   identify a distribution of a likelihood of changes in the successively reconstructed magnetic resonance images from the training data, in the space spanned by either: geometrical space alone or the combination of the geometrical space and temporal frequency; and
   reconstruct the successively reconstructed magnetic resonance images directly from the respective sets of magnetic resonance signals of the dynamic series on the basis of the identified distribution of the likelihood of changes in a static image and the spatial sensitivity profile.

6. A computer readable medium comprising instructions for controlling a computer system configured for performing a magnetic resonance imaging method comprising steps of:
   acquiring a set of training data of magnetic resonance signals;
   acquiring a dynamic series of sets of magnetic resonance data with a spatial sensitivity profile in an undersampled fashion;
   reconstructing a static image directly from at least one of the set of training data, the undersampled magnetic resonance data, and data acquired separately during time periods with little or no motion;
   identifying a distribution of a likelihood of changes in the successively acquired sets of magnetic resonance data directly from at least one of the static image and the training data, in a space spanned by geometrical space alone or by either: a combination of the geometrical space and temporal frequency;
   reconstructing the successively acquired sets of magnetic resonance data into a dynamic series of successively reconstructed magnetic resonance images on the basis of the identified distribution of the likelihood of changes the static image, and the spatial sensitivity profile.

7. A magnetic resonance imaging method to produce successive magnetic resonance images, the magnetic resonance imaging method comprising:
   acquiring temporally successive sets of magnetic resonance signals including at least a plurality of undersampled acquisition sets of magnetic resonance signals that are undersampled in k-t space;
   determining a static image from the acquired temporally successive set of magnetic resonance signals directly;
   determining a spatial distribution of a likelihood of changes from the acquired temporally successive sets of magnetic resonance signals directly; and
   reconstructing the plurality of undersampled acquisition sets of magnetic resonance signals using the determined static image and the determined spatial distribution of the likelihood of changes to produce a temporally successive set of magnetic resonance images.

8. The magnetic resonance imaging method as claimed in claim 7, wherein the determining of the static image includes:
   temporally combining data of the plurality of undersampled acquisition sets of magnetic resonance signals on a weighted basis to generate the static image.

9. The magnetic resonance imaging method as claimed in claim 7, wherein the acquiring of temporally successive sets magnetic resonance signals further includes:
   acquiring training data at a field of view of the reconstructed magnetic resonance images and at a spatial resolution that is lower than a spatial resolution of the reconstructed magnetic resonance images, the spatial distribution of likelihood of changes being determined from the training data.

10. The magnetic resonance imaging method as claimed in claim 9, wherein the determining of the spatial distribution of likelihood of changes includes at least one of:
    generating the spatial distribution of likelihood of changes as a Fourier reconstructed magnitude of the training data in x-f space, and
    generating the spatial distribution of likelihood of changes as a fixed temporal frequency filter in x-f space multiplied by a blurred thresholded version of the Fourier reconstructed training data.

11. The magnetic resonance imaging method as claimed in claim 7, wherein the acquiring of temporally successive sets of magnetic resonance signals further includes:
concurrently, acquiring the temporally successive sets of magnetic resonance signals using a plurality of receiver antennae.

12. The magnetic resonance imaging method as claimed in claim 7, wherein the reconstructing step determines a feasible solution, $\rho(\bar{x})$ which minimizes:

$$\int \|\rho(\bar{x}) - R_{static}(\bar{x})\|^2 / \|R_{dynamic}(\bar{x}) + \lambda\|^2 d\bar{x}$$

where $R_{static}(\bar{x})$ is the static image, showing the baseline signals; $R_{dynamic}(\bar{x})$ is a reference image showing the determined spatial distribution of changes, and $\lambda$ is a scalar which improves linearity.

13. The magnetic resonance imaging method as claimed in claim 12, wherein the sets of magnetic resonance signals are acquired in parallel with coils wit different sensitivity profiles and the reconstruction is determined as the solution of:

$$FT\{\rho(\bar{x}) \cdot S_j(\bar{x})\}(\bar{k}_t) = d_j(\bar{k}_t)$$

where FT{ } denotes a Fourier transformation, $\bar{x}$ denotes spatial co-ordinates and temporal frequency, $\bar{k}_t$ denotes k-space position and time, $S_j(\bar{x})$ and $d_j(\bar{k}_t)$ denote a sensitivity map of and a portion of the magnetic resonance signals that are received by a $j^{th}$ of the coils.

* * * * *